United States Patent [19]

Rossell

[11] 4,011,507

[45] Mar. 8, 1977

[54] FULL CYCLE CURRENT DETECTOR

[75] Inventor: Allen J. Rossell, Detroit, Mich.

[73] Assignee: Burroughs Corporation, Detroit, Mich.

[22] Filed: Nov. 10, 1975

[21] Appl. No.: 630,621

[52] U.S. Cl. .............................. 324/127; 307/235 N; 324/51; 324/133; 324/140 R; 328/151

[51] Int. Cl.² .................. G01R 19/16; G01R 31/02

[58] Field of Search ............ 324/127, 133, 140, 51; 328/135, 151; 307/235 N, 235 P; 340/248 A, 248 B, 248 C

[56] References Cited

UNITED STATES PATENTS

| | | | |
|---|---|---|---|
| 3,482,116 | 12/1969 | James | 307/235 N X |
| 3,585,507 | 6/1971 | Bickel | 328/151 X |
| 3,599,096 | 8/1971 | Stemples et al. | 324/140 R |
| 3,602,826 | 8/1971 | List et al. | 328/151 X |
| 3,609,683 | 9/1971 | Hoffman et al. | 328/135 X |
| 3,617,879 | 11/1971 | Mugnier | 340/248 A X |
| 3,620,069 | 11/1971 | Cole | 328/135 X |
| 3,725,795 | 4/1973 | Mesenhimer | 328/135 |
| 3,727,144 | 4/1973 | Senoo | 328/151 X |
| 3,728,615 | 4/1973 | Hill et al. | 324/140 R X |
| 3,815,011 | 6/1974 | Milkovic | 324/127 X |

*Primary Examiner*—Gerard R. Strecker
*Attorney, Agent, or Firm*—Robert J. Gaybrick; Richard A. Jordan; Kevin R. Peterson

[57] ABSTRACT

A circuit for detecting whether current flowing in an external circuit is zero or constant d.c., or is varying in amplitude or, in particular, alternating. A voltage is induced in the detection circuit in response to current flowing in the external circuit, and is compared to a preselected threshold voltage range by a plurality of voltage comparators. The output signal from the comparators is stored in a flip-flop, which generates a signal along a first path if the comparator output indicates that the induced voltage is within the preselected range, thereby indicating zero d.c. or constant d.c. current in the external circuit, or along a second path if the comparator output indicates that the induced voltage is outside the preselected range, thereby indicating varying d.c. or a.c. current in the external circuit.

11 Claims, 2 Drawing Figures

FULL CYCLE CURRENT DETECTOR

BACKGROUND OF THE INVENTION

1. Field of the Invention

This invention relates to detector circuits, and more particularly to circuits for detecting the presence or absence of current having a varying amplitude, or specifically alternating current, flowing in an external circuit, and for generating a digital signal in response thereto.

In situations in which the presence or absence of, in particular, an alternating current flowing in one electrical circuit is indicative of the operational condition of that circuit, it is often desirable to provide a current detection circuit that can give a rapid indication of the interruption of current to the first circuit. The indication of such an interruption may be utilized, for example, to actuate a second circuit having an effect opposing that of the first circuit. The current detector may be effectively used to determine that the first circuit, which may actuate a control load such as a motor, has switched itself off and cleared itself before the actuation of, e.g., a motor brake circuit.

2. Description of the Prior Art

Heretofore, alternating current detection systems have presented several problems. For example, the circuits responded relatively slowly to changes in the state of the a-c voltage applied thereto, requiring several cycles to indicate whether an external circuit had cleared. Another problem was that the prior art circuits themselves imposed a large load on the external circuit, wasting energy and bleeding power therefrom. Still another problem was that prior art circuits have generally had analog outputs rather than digital outputs. As a result, some means must be provided to avoid an erroneous indication that alternating current in the external circuit has been interrupted when the current passes through zero during the normal change in polarity associated with alternating currents. U.S. Pat. No. 3,725,795, issued to L. O. Hesenhimer on Apr. 3, 1973, utilizes an R-C network to obviate this problem; however such circuits generally require a time delay after current interruption before the detection circuit indicates that current in the external circuit has switched off. Furthermore, because the prior art devices have analog outputs, they are not directly and immediately compatible with digital switching circuitry.

SUMMARY OF THE INVENTION

It is therefore an object of the present invention to provide an improved circuit for detecting the presence or absence of varying or alternating current in an external circuit.

It is a further object to provide a detector having a digital output compatible with digital switching circuitry.

It is a further object to provide a circuit that generates a signal along a first path if the current in the external circuit is constant or zero, and along a second path if the current in the external circuit is varying or alternating.

It is yet another object of this invention to provide a circuit having an output representing a correlation of the states of current in the external circuit at a plurality of immediately successive clock pulses.

It is a further object to provide a current detection circuit for use with a plurality of external circuits, having an output indicative of a preselected correlation of the currents flowing in the individual external circuits.

It is still another object to provide a current detector that avoids indicating an interruption in current in the external circuit as the alternating current passes through zero during the normal polarity reversal associated with alternating currents.

It is a further object of this invention to provide a detector having a negligible load on the external circuit being monitored.

It is yet another object to provide a detector that is non-responsive to noise in the external circuit line.

The invention disclosed herein provides a detecting circuit having a sensor for sensing the current condition in an external circuit and inducing a voltage in the detecting circuit in response thereto. A low or zero voltage is induced if the current in the external circuit is constant or zero, and a varying or alternating voltage is induced if the current level varies or alternates. Comparators compare the induced voltage with a preselected threshold voltage range. The output of the comparators assumes a first state if the induced voltage is inside the preselected range, indicating a zero or constant current in the external circuit, and a second state if the induced voltage is outside the range, indicating a varying or alternating current in the external circuit. The output of the comparators is fed into a flip-flop which is periodically clocked when current in the external circuit would be expected to be both non-zero and varying. The clocking causes the flip-flop to store information relating to the state of the current flowing in the external circuit when the flip-flop is clocked. This avoids an erroneous storage which would result if the flip-flops are clocked when, for example, alternating current is changing polarity. The flip-flop generates a signal at one output thereof when the output from the comparators is in the first state, and at the second output when the comparator output is in the second state.

In a preferred embodiment, plural flip-flops are connected to form a shift-register, so that a succesive flip-flop stores information as to the state of the external circuit at the next previous clock pulse. The respective outputs of the flip-flops are correlated together through AND gates, which pass a signal along one path if the outputs of all flip-flops indicate zero or constant current in the external circuit, or along a second path if they indicate a varying or alternating current.

In a second embodiment, a circuit is provided for use with a plurality of external circuits. Each external circuit is provided with a detection circuit, the outputs of which are then correlated in a preselected pattern, the output of the second embodiment comprising the correlation.

BRIEF DESCRIPTION OF THE DRAWINGS

The aforementioned objects and features of the herein disclosed invention, as well as other objects and advantages thereof, will be better understood upon consideration of the following detailed description when read in conjunction with the drawings in which.

DETAILED DESCRIPTION OF THE PREFERRED EMBODIMENT

Figure 1:
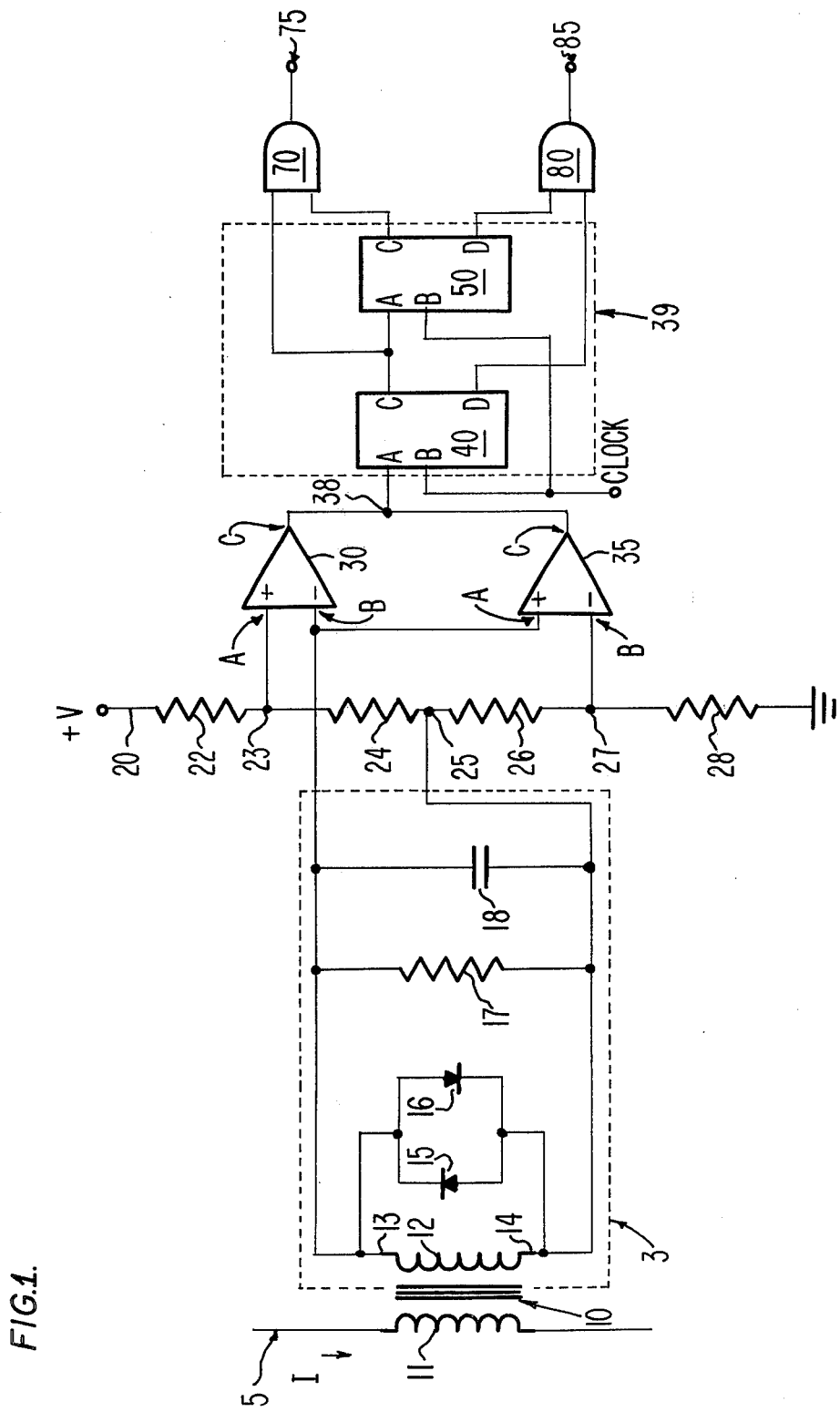
FIG. 1 shows a single current detection circuit.

Detection circuit 3, shown in FIG. 1, is provided with a transformer 10 for coupling it to external circuit 5. Primary winding 11 forms part of external circuit 5, and secondary winding 12 forms part of detection circuit 3. Secondary winding 12 is provided with ends 13 and 14 for connection to the remainder of circuit 3. Diodes 15 and 16 are connected between ends 13 and 14 in parallel oppositely poled manner; resistor 17 and capacitor 18 are also connected in parallel between ends 13 and 14.

Voltage divider 20 is formed of series resistors 22, 24, 26 and 28, having junctions therebetween designated 23, 25 and 27, the resistors being placed between an external voltage source and the circuit ground. Junction 25 provides a voltage reference point for sensing circuit 3, and junctions 23, between resistors 22 and 24, and 27, between resistors 26 and 28, provide threshold potentials of approximately 100 mV above and below the reference. The voltage divider is constructed so that resistors 24 and 26 have the same value. Side 14 of transformer secondary 12 is connected to reference junction 25.

Sensing circuit 3 is further provided with a pair of voltage comparators, amplifiers 30 and 35, having non-inverting inputs designated 30A and 35A respectively, inverting inputs designated 30B and 35B respectively, and outputs designated 30C and 35C respectively. Amplifier 30 is provided to respond to a positive voltage at secondary end 13 with respect to secondary end 14, and amplifier 35 is provided to respond to a negative voltage at the same point. To accomplish this, non-inverting input 30A of amplifier 30 is connected to junction 23 of voltage divider 20, and inverting input 30B is connected to end 13 of transformer secondary 12. In like manner, non-inverting input 35A of amplifier 35 is connected to transformer secondary end 13, and inverting input 35B is connected to junction 27 of voltage divider 20. Outputs 30C and 35C of amplifiers 30 and 35 respectively, are connected (ORed) together at node 38.

Two flip-flops 40 and 50 are provided for storing the combined output from amplifiers 30 and 35 and for transmitting a digital signal along a first path if the output indicates that current I in external circuit 5 is constant direct current or zero current, or along a second path if the output indicates the presence of a varying direct current or an alternating current. Each flip-flop has a data input 40A and 50A, a clock input at 40B and 50B and outputs 40C and D and 50C and D, where outputs 40C and 50C are provided for indication of zero I or a constant direct current I, and outputs 40D and 50D are provided for indication of varying direct current or alternating current. Outputs 40C and 50C are connected to the inputs of AND gate 70, and outputs 40D and 50D are connected to the inputs of AND gate 80. AND gate 70 is provided to indicate a non-varying or zero direct current I, and AND gate 80 is provided to indicate a varying direct current or alternating current I. The outputs 75 and 85 of AND gates 70 and 80, respectively, are connected to circuitry for utilization of this information. The circuitry may provide control for such as, for example, a motor and brake therefor, but it is to be understood that the invention disclosed herein is not limited thereto.

Operation of sensing circuit 3 will now be described. A current I in external circuit 5 flows through primary winding 11 of transformer 10, inducing a voltage in secondary 12. Diodes 15 and 16 limit the voltage drop across secondary 12, and reflect back to primary winding 11 to reduce the load imposed by the sensing circuit 3 and to keep the voltage drop small in external circuit 5, the diodes serving to clamp the voltage between predetermined limits. Resistor 17 and capacitor 18 serve to filter out noise present in the induced voltage.

Voltage divider 20 provides a voltage reference point at junction 25, and threshold voltages at junctions 23 and 27. Junction 25 serves as the voltage reference point for the voltage induced in transformer secondary 12.

Comparator amplifiers 30 and 35 conjointly compare the induced voltage to a particular threshold voltage, amplifier 30 comparing it to the positive threshold at junction 23, and amplifier 35 comparing it to the negative threshold at junction 27. The threshold voltages are designated positive and negative with respect to the reference voltage at junction 25. Amplifier 30 is provided for induced voltages positive with respect to the reference voltage, and amplifier 35 is provided for negative induced voltages. Thus, assuming a non-constant current I is flowing in external circuit 5, as the induced voltage increases to a level above the positive threshold voltage at junction 23 the output of amplifier 30 goes from high to low. The amplifiers 30 and 35 are so joined that ORed node 38 goes low when the output of one amplifier 30 or 35 goes low regardless of the output of the other amplifier, and consequently a low signal is inputed to flip-flop 40A.

Similarly, if the induced voltage decreases to a level below the negative threshold voltage at junction 27, the output 35C of amplifier 35 will go low, driving node 38 low. If, however, the induced voltage is between the positive and negative threshold, the outputs of both amplifiers 30 and 35 will be high, and consequently node 38 will be high, indicating a zero or constant current I, or a current I which varies to a negligible extent. The threshold voltages must be chosen so as to be small enough to indicate any current I, small enough to be of interest, and yet large enough that voltages induced by extraneous sources, such as A-C hum or noise, will not cause the amplifiers to trigger.

Flip-flops 40 and 50 form a shift register 39, with information as to the state of external circuit 5 stored in flip-flop 40 at a first clock pulse being shifted to flip-flop 50 at a second successive clock pulse. Information as to the state of circuit 5 at the instant of the second clock pulse is stored in flip-flop 40 by the second pulse. Therefore, information held by the flip-flops, and hence inputed to AND gates 70 and 80, represents the state of external circuit 5 at two successive points in time. Otherwise stated, sampling the state of circuit 5 at two successive points in time represented by successive clock pulses allows the state of circuit 5 to be sensed.

By way of explanation, a low signal at input 40A, signifying a varying d.c. or an a.c. current I, is at a first clock pulse stored in flip-flop 40. Thus output 40C will be low and 40D will be high. On the next clock pulse, flip-flop 50 will store the output signal from 40C, thus output 50C will be low and 50D high. Flip-flop 40, at the second clock pulse will store information from amplifiers 30 and 35 at that time; if the output from amplifiers 30 and 35 is low, output 40C will remain low and 40D will remain high; if it is high the outputs will be reversed.

The four conditions circuit 3 responds to may be described as follows. First, the outputs from amplifiers 30 and 35 may be both high for two consecutive clock pulses (indicating zero or constant current I). Second, either outputs may be low for each of two consecutive clock pulses (indicating varying d.c. or alternating current I). Third, the outputs may be changing from both being high to either being low for two consecutive clock pulses (indicating a change of state from zero or constant d.c. current I to varying d.c. or a.c. current I). Fourth, the outputs may be changing from either output being low to both being high at two consecutive clock pulses (indicating a change from varying d.c. or a.c. current I to zero or constant d.c. current I). As was mentioned above, if the output of either amplifier 30 or 35 goes low, indicating varying d.c. or a.c. current I, node 38 and consequently input 40A of flip-flop 40 similarly goes low.

In the first situation, in which the outputs of both amplifiers are high for two consecutive clock pulses, both outputs 40C and 50C are high and 40D and 50D are low after the two clock pulses. Therefore, the output 75 of AND gate 70 is high and output 85 of AND gate 80 is low, indicating a zero or constant d.c. current I in external circuit 5.

In the second situation, in which the output of either amplifier 30 or 40 is low at each of two consecutive clock pulses, both outputs 40C and 50C are low and 40D and 50D are high after the two clock pulses. Therefore, the output 75 of AND gate 70 is low and output 85 of AND gate 80 is high, indicating a varying d.c. or a.c. current I in external circuit 5.

In the third and fourth situations, where the outputs of the amplifiers changes from both being high to one being low at the two consecutive clock pulses, or vice versa, one of output 40C or 50C is high and the other is low, and one of output 40D or 50D will similarly be high or low, after two clock pulses. Therefore, neither output 75 or 85 of respective AND gates 70 and 80 will be high, indicating the ambiguous situation in which the state of current I in external circuit 5 is changing.

The flip-flops should be clocked at times when a non-zero varying current I would be present in external circuit 5, if, indeed, it is present there. Thus, assuming I to be a.c., clocking during the zero-crossover points where the current polarity reverses, would give an erroneous indication of the state of circuit 5. It is readily apparent that clocking during each half cycle, whether once or several times, is appropriate, as long as the crossover points are avoided.

It is readily apparent that shift register 39 may comprise more than two flip-flops, or that separate flip-flops may be connected to the amplifiers 30 and 35 to store positive and negative information separately. It is further apparent that the inputs to the respective AND gates need not come from the respective outputs of all of the flip-flops. It may be desired, for example, that only outputs of alternating flip-flops be connected to respective AND gates, or the outputs of other preselected patterns may be so connected to the respective AND gate inputs.

Figure 2:
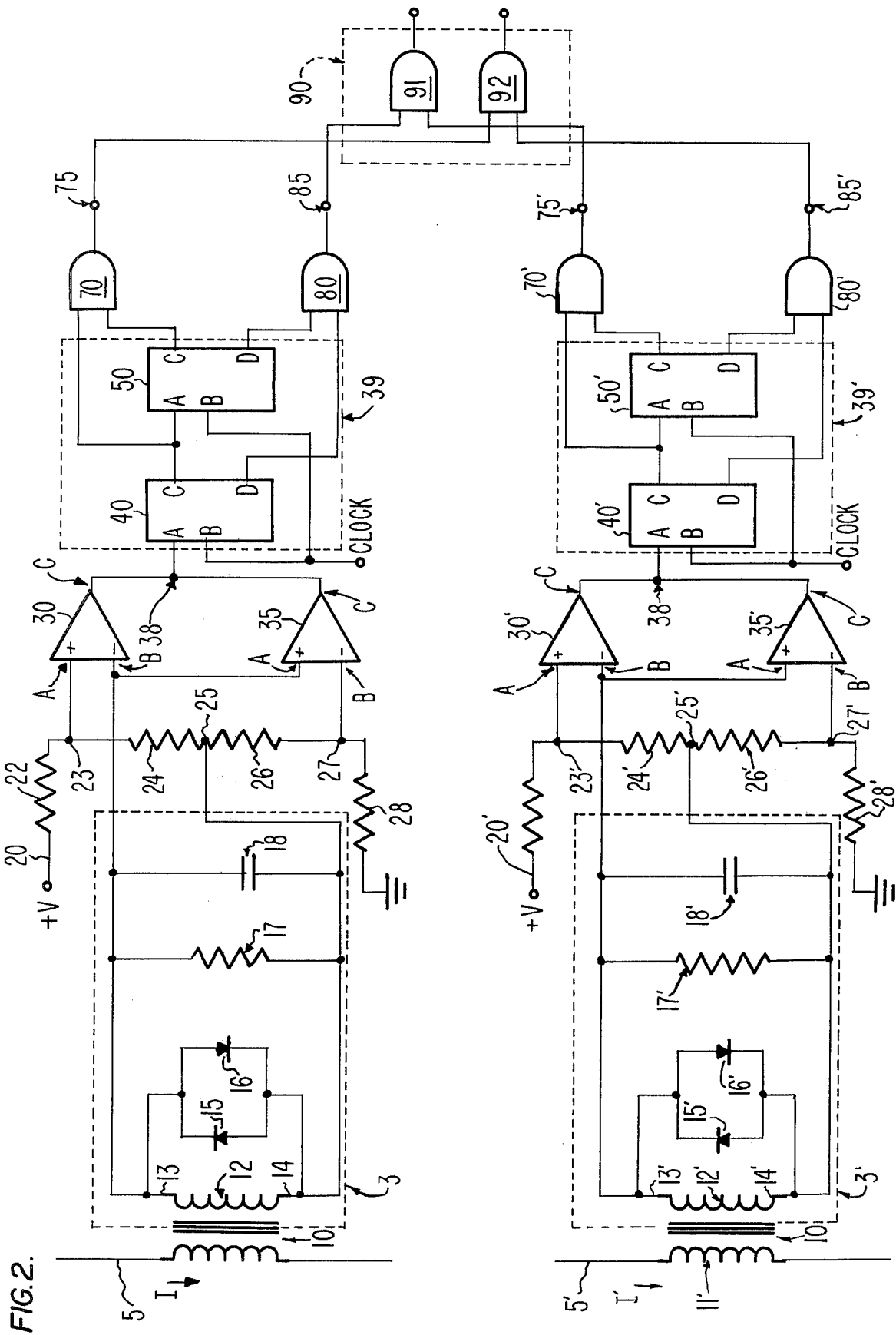
FIG. 2 shows a modification of the circuit shown in FIG. 1, in which plural current detection circuits are provided and the outputs of the circuits are correlated in a preselected pattern.

FIG. 2 illustrates a second embodiment of this invention showing a first detection circuit 3 for sensing the current condition I of a first external circuit 5, and a second detection circuit 3' for sensing the current condition I' of a second external circuit 5'. First external circuit 5 may comprise, for instance, a circuit for actuating a motor and second external circuit 5' may comprise a motor brake circuit. Means 90 may be provided to correlate the outputs of detection circuits 3 and 3' to ensure, for example, that external circuits 5 and 5' are not both on or off simultaneously. AND gates 91 and 92 are provided as examples or correlation means 90, AND gate 91 having inputs from output 85 of detection circuit 3 and output 75' of detection circuit 3', and AND gate 92 having inputs from outputs 75 and 85'. It is apparent that AND gate 91 will have a high output only if varying d.c. or a.c. current I is flowing in external circuit 5 and if zero or constant d.c. current I' is flowing in external circuit 5', situation. Therefore, in the situation in which only a.c. current may flow, a high output at either AND gate 91 or 92 specifies in which external circuit 5 or 5' a.c. current is flowing.

Having described the preferred embodiments of the invention, it will be obvious to those skilled in the are that various modifications may be made therein without departing from the spirit and scope of the invention and it is to be understood that the scope of the invention is not to be limited to the disclosed embodiment, which invention is intended to be limited only as defined by the appended claims.

What is claimed is:

1. A circuit for detecting current flowing in an external circuit and for generating discrete outputs responsive thereto the outputs respectively identifying current in the external circuit which is either (1) constant zero or constant direct current or (2) both non-zero and varying, said circuit comprising:
   means for sensing current flowing in the external circuit and for generating a voltage in accordance with the magnitude of the current;
   means for establishing a preselected threshold voltage range;
   comparing means for generating first signals when said voltage is within said preselected voltage range and second signals when said voltage is outside said preselected voltage range; and
   means associated with said comparing means for triggering a first output means in response to successive first signals and for triggering a second output means in response to successive second signals.

2. A detecting circuit as defined in claim 1 in which said sensing means comprises a transformer having a primary winding in the external circuit and a secondary winding in the detecting circuit.

3. A detecting circuit as defined in claim 1 wherein said establishing means comprises a plurality of resistors connected in series across a voltage supply and said voltage range comprises the difference between voltages at a plurality junctions between said resistors.

4. A detecting circuit as defined in claim 1 in which said comparator means comprises a plurality of operational amplifiers.

5. A detecting circuit as defined in claim 4 in which a first voltage comparator compares said voltage to the more positive end of said voltage range and in which a second voltage comparator compares said voltage to the more negative end of said voltage range.

6. A circuit as defined in claim 1 wherein said first output means comprises a first AND gate having an output, a first input and a second input and said second output means comprises a second AND gate having an output, a first input and a second input.

7. A circuit as defined in claim 6 wherein said means associated with said comparing means comprises:
  a first flip-flop means and a second flip-flop means, each said flip-flop means having a voltage input, a clock input, a current-constant output and a current-varying output, said voltage input of said first flip-flop means connected to said comparing means for receiving said first and second signals, said current-constant output of said first flip-flop means connected to said voltage input of said second flip-flop means and the current-constant output of said first flip-flop means and the current-constant output of said second flip-flop means respectively connected to first and second inputs of said first AND gate, the current-varying output of said first flip-flop means and the current-varying output of said second flip-flop means respectively connected to said first and second inputs of said second AND gate; and
  clock means associated with said clock input of said first flip-flop means and said clock input of said second flip-flop means for triggering at a first clock pulse either said current-constant output of said first flip-flop means in response to a first signal or said current-varying output of said first flip-flop means in response to a second signal and for transferring at a second clock pulse the state of said first flip-flop means to said second flip-flop means and for triggering at said second clock pulse either said current-constant output of said first flip-flop means in response to a first signal or said current-varying output of said first flip-flop means in response to a second signal.

8. A circuit for detecting current flowing in an external circuit having a varying amplitude and for generating an output representing a correlation of the state of said current at different times represented by clock pulses, said detecting circuit comprising: means for sensing current flowing in the external circuit and for generating a voltage in accordance with the magnitude of said current;
  means for establishing a preselected threshold voltage range;
  comparing means for generating first signals when said voltage is within said preselected voltage range, and second signals when said voltage is outside of said preselected voltage range;
  clock means; and
  shift register means clocked by said clock means and cooperating with said comparing means for storing the signals generated by said comparing means during a predetermined number of successive clock pulses, and for interrogating said successively stored signals to trigger a first output means if said succession of stored signals comprise said first signals, or a second output means if said succession of stored signals comprise said second signals.

9. A circuit as defined in claim 8 in which said shift register means comprises a first flip-flop and a second flip-flop, said first flip-flop serving to store the signals generated by the comparing means at a first clock pulse and at a second succeeding clock pulse to transfer said signal to said second flip-flop and to store the signal generated by said comparing means at said second clock pulse.

10. A circuit as defined in claim 9 in which said first output means and said second output means comprise respective AND gates.

11. A circuit for detecting currents flowing in any of a plurality of external circuits and for generating outputs identifying the currents as either (1) constant zero or constant direct current or (2) both non-zero and varying, said detection circuit comprising:
  a plurality of sensing means singly associated with respective ones of said plurality of external circuits for sensing current flowing therein, and for generating voltages in response to said currents;
  means for establishing a preselected threshold voltage range;
  a plurality of comparing means singly associated with respective ones of said plurality of sensing means, each comparing means generating first signals when the associated voltage is within said preselected range, and second signals when said associated voltage is outside of said preselected voltage range;
  a plurality of flip-flop circuit means singly associated with respective ones of said plurality of comparing means, each flip-flop circuit means triggering a first output means in response to successive said first signals and a second output means in response to successive said second signals; and
  means associated with said plurality of flip-flop means for correlating the outputs of said plurality of flip-flop means.

* * * * *